United States Patent
Young et al.

(10) Patent No.: US 6,177,836 B1
(45) Date of Patent: Jan. 23, 2001

(54) FEED FORWARD LINEARIZED TRAVELING WAVE TUBE

(75) Inventors: Albert M. Young, Whittier; Samuel Seth Osofsky, Torrance, both of CA (US)

(73) Assignee: The Aerospace Corporation, El Segundo, CA (US)

(*) Notice: Under 35 U.S.C. 154(b), the term of this patent shall be extended for 0 days.

(21) Appl. No.: 09/307,199

(22) Filed: May 7, 1999

(51) Int. Cl.[7] .................................................. H03F 3/58
(52) U.S. Cl. ................................ 330/43; 330/136; 315/3.5
(58) Field of Search ............................. 330/43, 149, 151, 330/136; 375/297; 315/3.5, 39.3

(56) References Cited

U.S. PATENT DOCUMENTS 4,701,717 * 10/1987 Radermacher et al. ............. 330/149
5,838,195 * 11/1998 Szmurlo et al. ..................... 330/43

OTHER PUBLICATIONS

Microwave Associates, Inc., "Instruction Manuel for Traveling Wave Tube Amplifier," (Jul. 11, 1967).
Katz, Allen, "TWTA Linearization," Microwave Journal, (Apr. 3, 1996).

* cited by examiner

*Primary Examiner*—Robert Pascal
*Assistant Examiner*—Khanh Van Nguyen
(74) *Attorney, Agent, or Firm*—Derrick Michael Reid

(57) ABSTRACT

A feed-forward linearization of a traveling wave tube amplifier linearizes the transfer function of the tube through a linearization voltage derived at baseband from the instantaneous amplitude of the input signal to control the cathode voltage causing induced phase modulation to offset the normal amplitude modulation to phase modulation conversion distortion. The feed forward linearization control results in reduced distortion for improved phase linearization of the tube over the operating range of the tube.

16 Claims, 4 Drawing Sheets

LINEARIZED TWTA SYSTEM

LINEARIZED TWTA SYSTEM

FIG. 1

TEST CONFIGURATION

FIG. 2

PREAMPLIFIER CIRCUIT

FIG. 3

RELATIVE INPUT POWER TWT PHASE RESPONSE

FIG. 4

OUTPUT POWER BACKOFF (dB)
TWT DISTORTION PROFILE

FIG. 5

FEED FORWARD LINEARIZED TRAVELING WAVE TUBE

BACKGROUND OF THE INVENTION

Traveling wave tube amplifiers (TWTA) are used to amplify and convert a low power input signal into a high power output signal and have been used for decades in a variety of applications. Modern satellite communications systems use TWTAs having high RF power output, high efficiency, minimum DC power consumption, and good linearity for low distortion. The design of TWTAs is usually based on a compromise among these requirements. A TWTA includes a traveling wave tube (TWT) in which electrons travel in an electron beam the physical length of the tube. Amplification occurs as a result of interaction between the electron beam and the electromagnetic fields produced by an input signal. An input signal modifies the velocity of the electrons so that the electron beam is modulated by an input signal. A cathode bias voltage, that is, an electron acceleration potential along the length of the tube, accelerates the electrons to the velocity required for the beam to interact with the electromagnetic fields produced by an input signal, thereby amplifying that input signal. The velocity of the electrons entering an input helix of the TWT is a function of the accelerating potential between the cathode and the helix. The electrical length of the tube depends upon the electron velocity, and therefore, the effective length of the TWT will be a function of the accelerating potential. Unwanted variations of the accelerating potential cause the tube to produce undesirable phase modulations of the output signal. Even though the accelerating potential is kept constant, high output signal levels can still cause the electrons in the beam to slow down. This decreased beam velocity causes the effective electrical length of the tube to increase, and thereby generates undesirable phase variations.

The radio frequency (RF) performance of the TWTA is primarily affected by two types of distortions, namely amplitude modulation to amplitude modulation (AM to AM) distortion (AM to AM conversion), and amplitude modulation to phase modulation (AM to PM) distortion (AM to PM conversion). Both types of distortion contribute to the generation of undesirable signal components including distortion products that accompany the desired high power output signal of the TWTA. These products are reflected in two conventional measurements, including third order intermodulation measurements and noise power ratio measurements. AM to PM conversion distortion occurs when variations in the instantaneous power of the input signal causes variations in the effective electrical length of the TWT. This AM to PM conversion distortion is small for low input power levels, but becomes more pronounced as the output power approaches saturation. Instantaneous variation of the input signal causes variation of the mean velocity of the electrons moving through the tube. Some of the kinetic energy of the electrons in the electron beam is ultimately converted to output signal power. As a result, the variation of the electron velocity causes a variation in the effective electrical length of the TWT, and therefore causes phase variations in the output signal. At higher output levels, a relatively large amount of energy is removed from the beam, which causes the mean electron velocity to be reduced. This causes the signal to propagate more slowly through the tube, and the tube becomes effectively electrically longer. Due to these interactions, the output phase is a nonlinear function of the instantaneous input power level.

AM to AM conversion distortion resulting in gain compression is caused by several factors that limit the amount of energy that is transferred from the modulated electron beam to the output helix. Included among the causes are complex changes in the electron beam density, and a reduction in the average velocity of the electrons in the beam. As a result, the slope of the amplitude transfer function decreases toward zero as the saturated power level is approached. Conventional linearizers contain circuitry for linearizing both phase and amplitude transfer functions. The conventional linearizer operates at the carrier frequency adding complexity and cost. Also, in the event that the linearizer fails, the entire TWTA will fail because the linearizer is in series with the input of the TWT. A failed linearizer would significantly attenuate the input signal. The traditional method of obtaining the required linearity as to both amplitude and phase has been to predistort the input signal or to operate the TWTA in a backoff condition, or both, resulting in a sacrifice in both power output and efficiency. Recently, linearizers have been employed to permit operation with reduced backoff while maintaining moderately high power output and efficiency. However, the linearizer increases the size, weight and complexity of the TWTA. Furthermore, the linearizers are matched to each TWT, preventing a general solution to TWT linearization. These and other disadvantages are solved or reduced using the invention.

SUMMARY OF THE INVENTION

An object of the invention is to provide efficient linearization of the transfer function of a traveling wave tube (TWT).

Another object of the invention is to modulate the acceleration potential of the TWT to linearize the intrinsic transfer function of the TWT.

Another object of the invention is to produce phase modulation of an input signal by direct variation of the acceleration potential.

Another object of the invention is to linearize the complete transfer function of a TWT amplifier by providing a correction signal to the acceleration potential of a TWT having a nonlinear intrinsic transfer function by detecting the input signal that is translated into the correction signal generated by a transfer function matched to the intrinsic transfer function.

The invention is directed to a feed-forward linearized traveling wave tube (TWT). The linearization of the TWT linearizes the AM to PM transfer function that is the dominant mechanism producing intermodulation products at modest levels of output power backoff. A linearization voltage derived from the instantaneous amplitude of the RF input signal is used to control the TWT cathode voltage. The transfer function of this feed-forward linearization control causes the induced TWT phase modulation to offset the normal amplitude modulation to phase modulation (AM to PM) conversion distortion of the TWT. The feed forward linearization control results in a reduction in the TWTA AM to PM conversion distortion, resulting in a decrease in the level of the third and higher-order intermodulation products. A correction circuit need only have a bandwidth equal to that of the baseband envelope information in the amplified input signal. The correction signal is amplified up to a level that is sufficient to modulate the cathode voltage of the TWT. This will vary with tube design but is in the order of +/−20 volts. Also, the linearization circuits are not in series with the signal path, therefore, failure of the linearization circuits will only degrade performance, but will not open the input signal path causing a catastrophic failure of the TWT.

Feed-forward linearization is the use of a correction voltage that is derived from the instantaneous level of the RF input signal and is applied to the cathode of the TWT, in series with the normal DC accelerating potential. In this way, the AM to PM distortion normally produced by a TWTA can be greatly reduced. The feed forward linearized TWTA uses the TWT as a phase modulator. For communications applications, the TWT itself can be used as a phase modulator. The correction voltage is derived from the envelope of the input signal, and the correction voltage is applied to the cathode of the TWT. The correction circuit works at baseband. AM to AM distortion can also be corrected by adding a modulator in series with the input signal to the TWT. The character of the correction transfer function can be easily tailored to fit a range of applications and tubes. These and other advantages will become more apparent from the following detailed description of the preferred embodiment.

DETAILED DESCRIPTION OF THE PREFERRED EMBODIMENT

Figure 1:
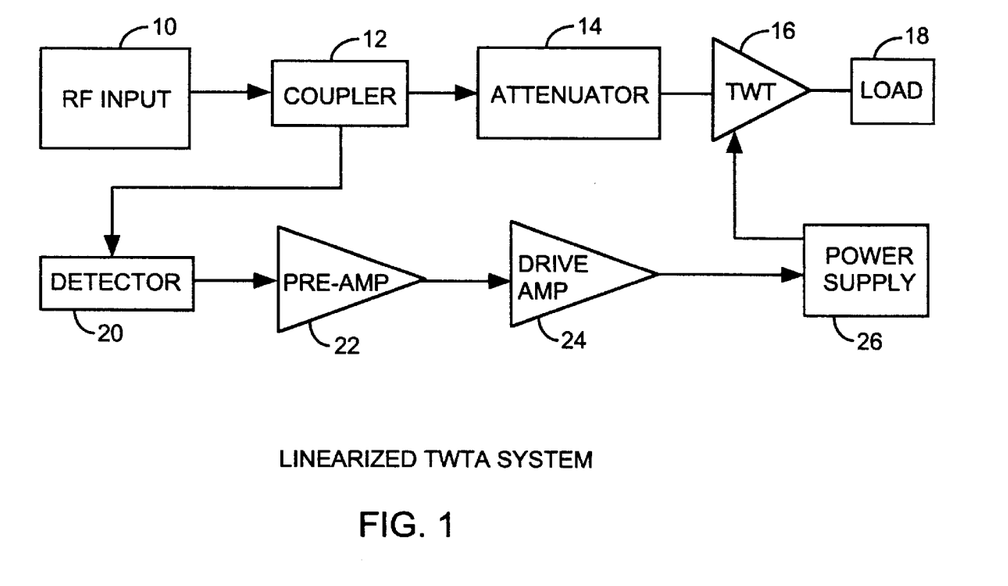
FIG. 1 is a block diagram of a traveling wave tube amplifier (TWTA) using feed-forward linearization.

An embodiment of the invention is described with reference to the figures using reference designations as shown in the figures. Referring to FIG. 1, the basic TWTA is comprised of the TWT 16, having input and output RF ports, and power supply 26, providing the required DC operating voltages to the TWT 16. An input RF signal 10 is communicated through a coupler 12 and an attenuator 14 to the RF input port of a traveling wave tube (TWT) 16 whose RF output port provides power to an arbitrary load 18 attached to that RF output port of the TWT. The TWT 16 has a predetermined gain and a nonlinear input to output intrinsic amplitude and phase transfer function. The attenuator 14 attenuates the input signal 10 to limit the range of the input signal into the TWT 16 that then provides a suitable output signal power level to the load 18. A detector 20 senses the envelope of the input RF signal 10 to provide a detected input signal to a preamplifier 22 that in turn provides a linearization correction signal to a high voltage driver amplifier 24 that in turn provides an amplified high voltage linearization correction signal that is combined in series with the DC cathode bias voltage from a power supply 26. The high voltage drive amplifier 24 amplifies the linearization correction signal from the pre-amplifier 22. The series combination of the DC bias from power supply 26 and the amplified linearization correction signal from driver amplifier 24 comprises the acceleration voltage applied to the cathode of the TWT 16. The amplified linearization correction signal is combined in series with the DC bias voltage from the power supply 26 to form the TWT cathode voltage having a linearization correction signal component and a DC bias component. The preamplifier 22 is used to generate the linearization correction signal that then drives the cathode of the TWT 16 to shape and change, that is linearize, the transfer function of the TWTA composed of the coupler 12, the attenuator 14, the TWT, the detector 20 the pre-amplifier 22, the drive amplifier 24, and the power supply 26.

Figure 2:
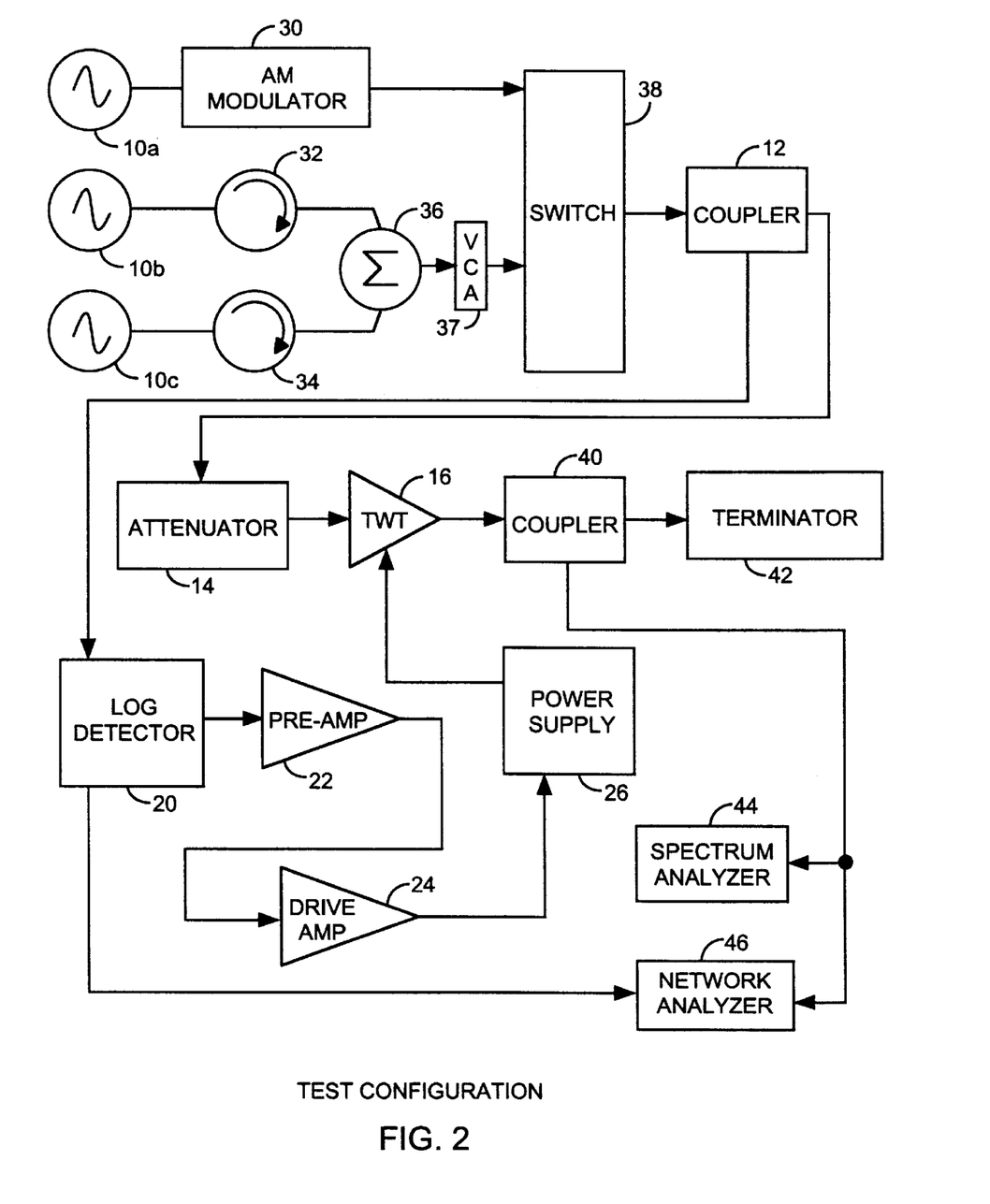
FIG. 2 is a block diagram of a test configuration for the TWTA.

Referring to FIG. 2, a test configuration is used to first adjust the preamplifier 22 to match the TWT intrinsic uncorrected transfer function so as to linearize the complete corrected TWTA transfer function. The test configuration can also be used to measure performance characteristics of the complete TWTA transfer function. An exemplar TWTA, such as a Hughes model 1277H02 TWTA is modified to allow for the introduction of a correction voltage onto the cathode of the tube. This modification was accomplished by removing the ground normally connected to the bottom of the DC cathode power supply, and instead connecting it to the output of a direct-coupled high voltage amplifier 24 to thereby combine in series the high voltage correction signal and the DC cathode power supply voltage. The high voltage amplifier 24 is capable of sinking the cathode current of the TWT 16, and supplying the AC drive signal for modulating the cathode potential of the TWT 16. The available bandwidth of the resulting correction circuit was set to ten kHz due to the limited bandwidth of the drive amplifier 24. This bandwidth is sufficient to demonstrate the effect of the correction signal on the operation of the exemplar TWT 16. Wide-band drive amplifiers together with more complicated schemes can be used when operating a wide-band TWTA.

The test configuration is capable of producing two different test signal waveforms. The first includes RF tone generator 10a that is modulated by modulator 30 with an off-set triangle wave that sweeps the input drive level of the TWT 16 over a range of approximately twenty dB. The second configuration includes first and second tone generators 10b and 10c connected through respective circulators 32 and 34 to a summer 36 providing a dual tone signal. A switch 38 is used to select either the modulated RF tone signal or the dual tone signal. The TWT 16 is connected through a coupler 40 to a terminator 42 functioning as a test load. The phase and amplitude of the input and output signals can be measured using a modified vector network analyzer 46. A spectrum analyzer 44 can also be used to measure spectral content of the output signal. The resulting intrinsic uncorrected and complete corrected transfer functions of the TWTA can be determined by engaging and disengaging the correction, respectively for comparison. When selecting the modulated RF tone source 10a by switch 38, parameters that control the nature of the correction signal communicated to the cathode of the TWT 16 can be adjusted for minimum phase distortion. When selecting the dual tone signals using switch 38, a two-tone test can be performed in which the effect of the correction voltage on distortion and output power back-off can be determined.

Figure 3:
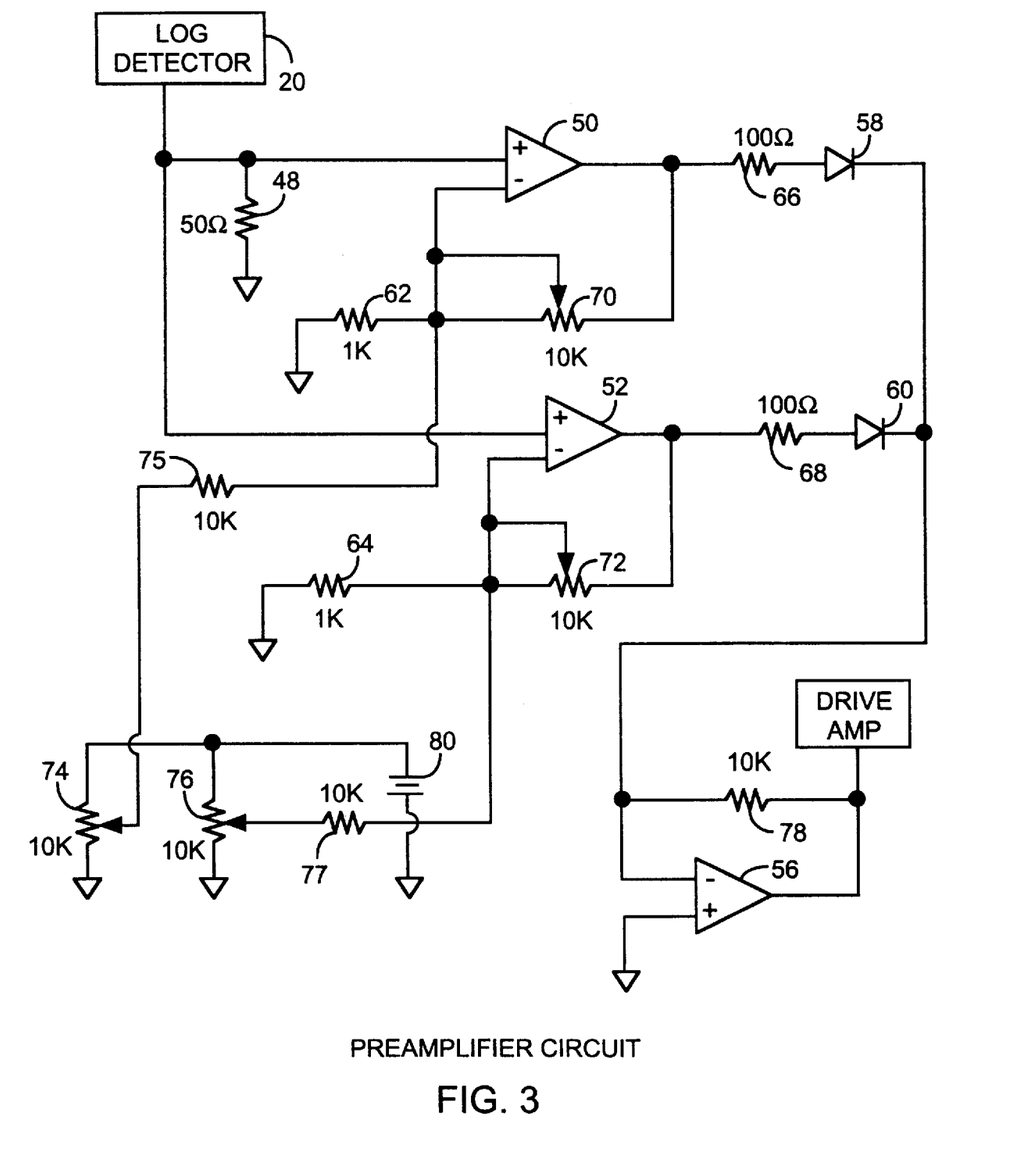
FIG. 3 is a schematic of a preamplifier circuit.

Referring to FIGS. 2 and 3, and more particularly to FIG. 3, the purpose of the preamplifier 22 is to shape the intrinsic transfer function of the TWT into the complete transfer function using the feed-forward correction signal. The preamplifier 22 has a preamplifier transfer function to provide a correction response to the detected input signal. The response of the preamplifier 22 to the detected input signal controls the correction signal applied to the cathode of the TWT 16. This approach matches the correction signal to the specific nonlinearity of the intrinsic transfer function of the TWT to thereby perfect the complete transfer function of the TWTA.

The exemplar preamplifier 22 includes an input resistor 48, a first and second amplifier 50 and 52, and a buffer amplifier 56 respectively connected through two threshold diodes 58 and 60 to the first and second amplifiers 50 and 52. The first and second amplifiers are respectively connected to shunt feedback resistors 62 and 64, output resistors 66 and 68, gain potentiometers 70 and 72, offset potentiometers 74 and 76, and input resistors 75 and 77. The buffer amplifier 56 is connected to a feed back resistor 78. The potentiometers 70, 72, 74 and 76 provide four variable parameters, two gain adjustments using potentiometers 70 and 72, and two offset adjustments using potentiometer 74 and 76. Each of the first and second amplifiers 50 and 52 receive a common input signal from the logarithmic detector 20. The offset potentiometers 74 and 76 are connected to a suitable voltage reference 80. The amplifiers 50 and 52 create first and second gain scaled and offset shifted replica signals of the detected input signal at the output resistors 66 and 68. The first and second replica signals are communicated to the buffer amplifier 56 respectively through threshold diodes 58 and 60. The offset potentiometers 74 and 76 set threshold levels. The diodes 58 and 60 provide the replica signals to the buffer amplifier 56 when the replica signal exceeds the threshold levels. The buffer amplifier 56 adds the two replica signal when either one or both exceed the threshold level. The two gain adjustments set the magnitudes of the contributions made to the common output signal produced by each replica signal. Using this preamplifier circuit, a three segment transfer function of the preamplifier 22 can be produced, in which the first segment is identically zero, in which the second segment is controlled by the gain and offset of the first amplifier, and in which the third segment is controlled by the gain and offset of both the first and second amplifiers. Hence, this exemplar preamplifier circuit 22 provides a segmented transfer function. Those skilled in art of circuit design can well configure a variety of preamplifier circuits having segmented or continuous response functions suitable for matching to the nonlinear intrinsic transfer function of the TWT 16.

The detector 20 is a logarithmic detector producing an analog voltage representing the instantaneous input drive power level to the detector 20. This analog voltage is an input to a preamplifier 22 that contains the pair of threshold diodes 58 and 60 and the associated first and second variable gain offset amplifiers 50 and 52. These adjustments to the potentiometers 70, 72, 74 and 76 are used to shape the transfer function of the preamplifier 22 that provides a response for shaping the phase transfer function of the TWTA. The threshold diodes 58 and 60 operate to couple the output of the associated amplifiers 50 and 52 as an output of the preamplifier when the output signal of the amplifiers 50 and 52 exceeds a specified value. The output of each of the two variable gain amplifiers 50 and 52 are combined by the buffer amplifier 56 to produce the resulting linearization correction signal to the drive amplifier 24. The transfer function of the preamplifier 22 can be adjusted to produce the desired linearization correction signal. The output of the preamplifier 22 is connected to the input of the drive amplifier 24 that then is combined in series with the DC bias voltage to then drive the cathode of the TWT 16. The threshold offsets and gains of potentiometers 70, 72, 74 and 76 are set so that the linearization correction signal minimizes the overall distortion in the complete phase transfer function of the TWTA.

The proper settings of the threshold circuits need to be set for optimal linearization correction. As the input drive level varies, the preamplifier thresholds and gains can be adjusted to flatten out the phase variation of the intrinsic transfer function of the TWT 16 output as observed on the network analyzer 46. Once established, these adjustments are used during the two-tone measurements and normal amplifier operations. In this example, the two-tone measurements can be made using the pair of frequency locked sources 10b and 10c operating at seven giga-hertz, and differing in output frequency by approximately three hundred hertz, were combined to form the input signal to the TWT 16. Circulators 32 and 34 protect the sources 10b and 10c from cross coupling. Each source may be locked to a ten mega-hertz reference in order to control the stability of the input signal through the coupler 12. The two seven giga-hertz output signals are combined by summer 36 that may comprise by example, a hybrid waveguide 36. The output of the summer 36 is communicated to the input of a voltage-controlled attenuator 37 that allows for control of the input level to the exemplar TWTA. The summer provides the two tone signal to the TWT 16 through the voltage-controlled attenuator 37, switch 38, coupler 12 and attenuator 14. The output levels of the two sources 10b and 10c are made to be equal, and the voltage-controlled attenuator 37 is used to slowly vary the input signal level to the TWTA during the course of the third order intermodulation distortion measurements. A spectrum analyzer 44 is used to measure the carrier and side-band levels as the input signal level is varied. This procedure is implemented with the correction preamplifier circuit 22 both enabled and disabled for taking comparison measurements of the phase response and the amount of signal distortion.

Figure 4:
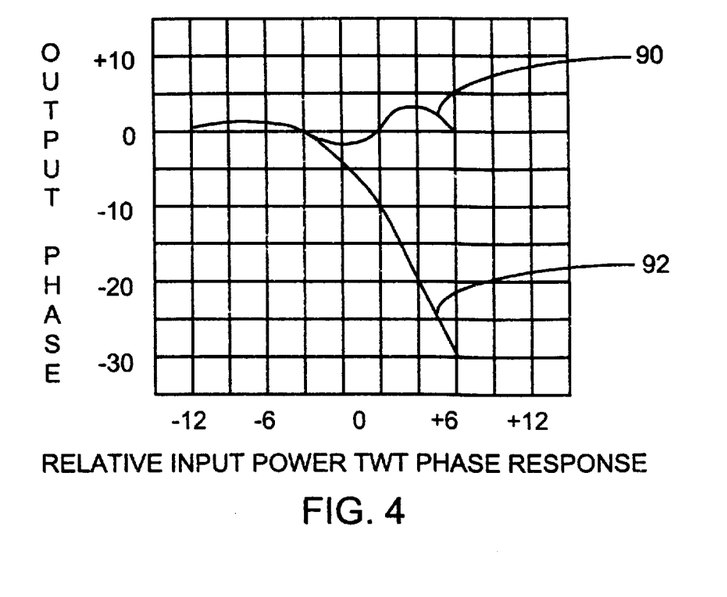
FIG. 4 is a graph of the TWT phase response.

Referring to FIG. 4, the complete phase transfer function of a typical TWTA has a level response 90 using the linearization correction signal. The response 90 is an improvement over the intrinsic phase transfer function response 92 without the use of linearization correction. The AM to PM conversion distortion of the output signal occurs at a much lower level of the input signal than the AM to AM distortion. For this reason, a significant improvement in the overall TWTA performance can be achieved by correcting the phase transfer characteristic alone. The uncorrected phase transfer function 92 of the TWTA is nearly flat at low levels, and gradually decreases to a maximum negative slope as the output level approaches saturation. The reason for using two pairs of threshold and gain adjustments is to provide degrees of freedom needed to achieve a reasonably good segmented approximation to the required correction voltage. When properly adjusted, this preamplifier circuit 22 applies the correction in a way that complements the intrinsic nonlinear transfer function of this TWT 16. Other specific TWTs may require different correction circuits, offsets and gains in order to achieve optimal performance.

Figure 5:
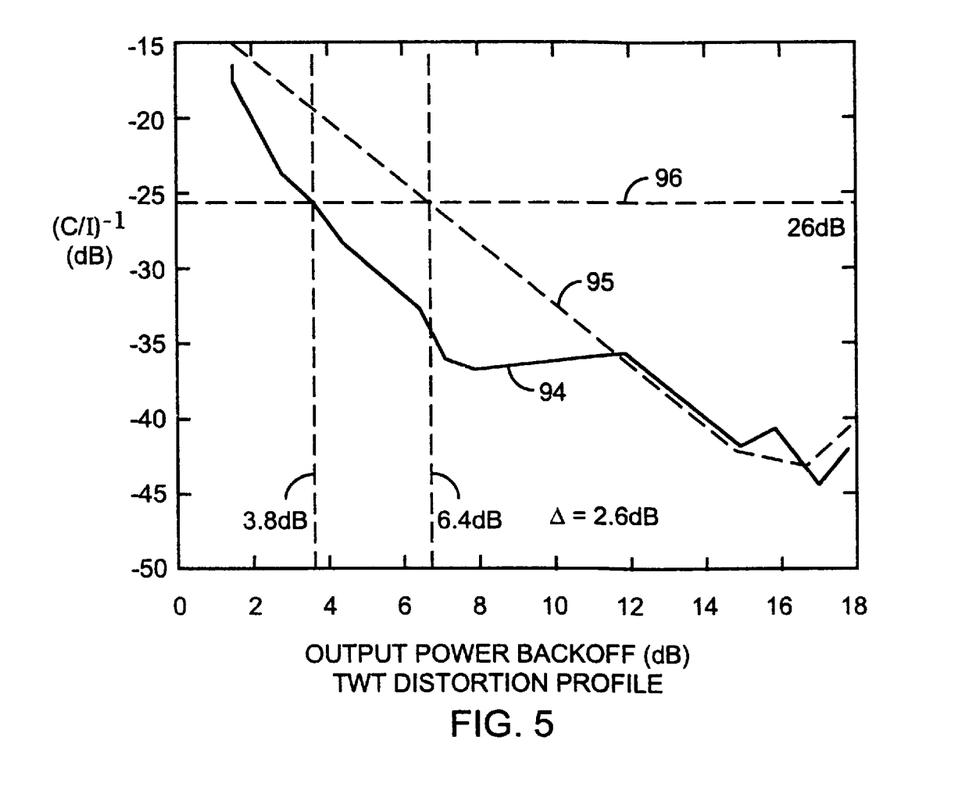
FIG. 5 is a graph of the TWT distortion profile.

Referring to FIG. 5, the improvement in third order intermodulation performance and in output power backoff is computed with respect to the inverse carrier over intermodulation power ratio $(C/I)^{-1}$. The inverse C/I ratio is a function of the input drive level and is measured as a function of the output power or output power backoff. At an inverse C/I ratio of −26 dB 96, the application of the preferred embodiment provides a 2.6 dB improvement in backoff power that results in an improved power efficiency. In the case with phase linearization 94 and in the case without phase linearization 95, the respective backoff levels were computed at 3.8 dB and 6.4 dB, respectively. At the inverse C/I ratio of −26 dB, the improvement in output power backoff is 2.6 dB. Hence, at the same level of the inverse C/I ratio, the linearization enables a 2.6 dB reduction in the backoff level that results in improved power efficiency. In another aspect of the invention, a data bearing modulation signal can be used to phase modulate the input signal that may be a carrier or subcarrier signal so as to transmit data through the TWT using modulation of the cathode terminal. Knowing the steady state condition of the input signal, the accelerating potential can function as either a linearization correction signal or a data bearing signal or better. Those skilled in the art can make enhancements, improvements and modifications to the invention, and these enhancements, improvements and modifications may nonetheless fall within the spirit and scope of the following claims.

What is claimed is:

1. A linearized traveling wave tube amplifier (TWTA) for amplifying an input signal at an input terminal into an output signal at an output terminal for driving an arbitrary load, the linearized TWTA comprises,
   a traveling wave tube (TWT) having an intrinsic transfer function between an input for receiving the input signal and an output for driving the load, the TWT has a control terminal between the input terminal and the output terminal for controlling amplification when amplifying the input signal into the output signal, the intrinsic transfer function provides a nonlinear phase response of the TWT between the input signal and the output signal,
   a detector for sensing the input signal and for providing a sensed input signal, and
   a preamplifier having a preamplifier transfer function for receiving the sensed input signal and providing a correction signal, the correction signal is coupled to the control terminal, the preamplifier transfer function is matched to the intrinsic transfer function of the TWT to produce a complete transfer function of the TWTA having a linearized phase response between the input signal and output signal.

2. The TWTA of claim 1, wherein, the detector senses power levels of the input signal, and the sensed input signal is a sensed power level input signal.

3. The TWTA of claim 1, wherein the control terminal is a cathode, the TWTA further comprises,
   a power supply providing a DC bias potential and for combining the DC bias potential with the correction signal for providing a DC biased correction signal coupled to the cathode so as to couple the correction signal to the cathode.

4. The TWTA of claim 1, wherein the control terminal is a cathode terminal, the TWTA further comprises,
   a drive amplifier for receiving the correction signal and providing a high voltage correction signal, and
   a power supply providing a DC bias potential and for combining the DC bias potential and the high voltage correction signal as a high voltage DC biased correction signal applied to the cathode so as to couple the correction signal to the cathode.

5. The TWTA of claim 1, wherein the preamplifier comprises,
   a plurality of amplifiers for providing the preamplifier transfer function as a plurality of power level segmented transfer functions, the power level segmented transfer functions are matched to respective power level segmented transfer function portions of the intrinsic transfer function.

6. The TWTA of claim 1, wherein the intrinsic transfer function is divided into a plurality of power level segmented transfer function portions, the preamplifier comprises,
   a plurality of amplifiers for gain and power level offset settings for providing the preamplifier transfer function as a plurality of power level segmented transfer functions, the plurality of power level segmented transfer functions are respectively matched to the plurality of power level segmented transfer function portions.

7. The TWTA of claim 1 wherein the control terminal of the TWT is modulated by a data signal that is combined with the correction signal.

8. The TWTA of claim 7 wherein the input signal is a constant envelope carrier and the correction signal is a null.

9. A linearized traveling wave tube amplifier (TWTA) for amplifying an input signal into an output signal for driving an arbitrary load, the linearized TWTA comprising,
   a traveling wave tube (TWT) having an intrinsic transfer function between an input for receiving the input signal and an output for driving the load, the TWT has a cathode for amplifying the input signal into the output signal, the intrinsic transfer function provides a nonlinear phase response of the TWT between the input signal and the output signal,
   a detector for sensing the power level of the input signal and for providing a sensed power level input signal,
   a preamplifier having a preamplifier transfer function for receiving the sensed input signal and providing a correction signal, the preamplifier transfer function is matched to the intrinsic transfer function of the TWT to produce a complete transfer function of the TWTA having a linearized phase response between the input signal and output signal, and
   a drive amplifier for receiving the correction signal and providing a high voltage correction signal, and
   a power supply providing a DC bias potential for combining the DC bias potential and the high voltage correction signal for providing a DC biased high voltage correction signal to the cathode so as to couple the correction signal to the cathode.

10. The TWTA of claim 9, wherein the preamplifier comprises,
    a plurality of segment amplifiers for providing the preamplifier transfer function as a plurality of power level segmented transfer functions, the plurality of power level segmented transfer functions are matched to respective power level segmented transfer function portions of the intrinsic transfer function.

11. The TWTA of claim 9, wherein the intrinsic transfer function is divided into a plurality of power level segmented transfer function portions, the preamplifier comprises,
    a plurality of segment amplifiers has gain and power level offset settings for providing the preamplifier transfer function as a plurality of power level segmented transfer functions, the plurality of power level segmented transfer functions are respectively matched to the plurality of power level segmented transfer function portions.

12. A linearized traveling wave tube amplifier (TWTA) for amplifying an input signal into an output signal for driving an arbitrary load, the linearized TWTA comprising,
    a traveling wave tube (TWT) having an intrinsic transfer function between an input for receiving the input signal and an output for driving the load, the TWT has a cathode for amplifying the input signal into the output signal, the intrinsic transfer function provides a nonlinear phase response of the TWT between the input signal and the output signal,
    a detector for sensing the power level of the input signal and for providing a sensed power level input signal,
    a preamplifier having a preamplifier transfer function for receiving the sensed power level input signal and providing a correction signal, the preamplifier transfer function is matched to the intrinsic transfer function of the TWT to produce a complete transfer function of the TWTA having a linearized phase response between the input signal and output signal, the preamplifier comprises a plurality of segment amplifiers for providing the preamplifier transfer function as a plurality of power level segmented transfer functions, the power level segmented transfer functions are matched to respective power level segmented transfer function, portions of the intrinsic transfer function,
    a drive amplifier for receiving the correction signal and providing a high voltage correction signal, and a power supply providing a DC bias potential and for combining the DC bias potential and the high voltage correction signal for providing a DC biased high voltage correction signal to the cathode so as to couple the correction signal to the cathode.

13. The TWTA of claim 12, wherein the plurality of segment amplifiers have gain and power level offset settings for providing the preamplifier transfer function as the plurality of power level segmented transfer functions, the plurality of power level segmented transfer functions are respectively matched to the power level segmented transfer function portions of the intrinsic transfer function.

14. The TWTA of claim 12, wherein the cathode of the TWT is modulated by a data signal that is combined with the DC bias potential for providing a DC biased data signal to the cathode.

15. The TWTA of claim 14 wherein the input signal is a carrier signal and the output signal is modulated by the DC biased data signal.

16. The TWTA of claim 14 where the input signal is a subcarrier signal and the output signal is modulated by the DC biased data signal.

* * * * *

UNITED STATES PATENT AND TRADEMARK OFFICE
CERTIFICATE OF CORRECTION

| | | |
|---|---|---|
| PATENT NO. | : 6,177,836 B2 | Page 1 of 1 |
| APPLICATION NO. | : 09/307199 | |
| DATED | : January 23, 2001 | |
| INVENTOR(S) | : Albert M. Young and Samuel Seth Osofsky | |

It is certified that error appears in the above-identified patent and that said Letters Patent is hereby corrected as shown below:

In column one, line 4, please add the Statement of Government Interest after the Title but before the Background of the Invention.

Statement of Government Interest

The invention was made with Government support under contract No. F04701-93-C-0094 by the Department of the Air Force. The Government has certain rights in the invention.

Signed and Sealed this

Seventeenth Day of April, 2007

JON W. DUDAS
*Director of the United States Patent and Trademark Office*